United States Patent [19]
Conturo

[11] Patent Number: 5,352,979
[45] Date of Patent: Oct. 4, 1994

[54] MAGNETIC RESONANCE IMAGING WITH CONTRAST ENHANCED PHASE ANGLE RECONSTRUCTION

[76] Inventor: Thomas E. Conturo, 1000 Fell St., #224 Henderson's Wharf, Baltimore, Md. 21231

[21] Appl. No.: 927,120

[22] Filed: Aug. 7, 1992

[51] Int. Cl.$^5$ ............................................. G01V 3/00
[52] U.S. Cl. .................. 324/307; 128/653.4
[58] Field of Search .................. 324/307, 309, 312; 128/653.4, 653.2, 654

[56] References Cited

U.S. PATENT DOCUMENTS

| | | | |
|---|---|---|---|
| 4,625,169 | 11/1986 | Wedeen et al. | 324/309 |
| 4,766,381 | 8/1988 | Conturo et al. | 324/309 |
| 5,190,744 | 3/1993 | Rocklage et al. | 324/309 |
| 5,195,525 | 3/1993 | Pele | 324/309 |
| 5,219,553 | 6/1993 | Kraft et al. | 128/653.4 |

OTHER PUBLICATIONS

Wedeen et al., "Projective Imaging of Pulsatile Flow with Magnetic Resonance", 230 Science 946–948 (1985). (no month).

Young et al., "Clinical Magnetic Susceptibility Mapping of the Brain", 11 J. Comput. Assist. Tomogr. 2–6 (1987). (no month).

Rosen et al., "Perfusion Imaging with NMP Contrast Agents", 14 Magn. Reson. Med. 249–265 (1990). (no month).

*Primary Examiner*—Louis Arana
*Attorney, Agent, or Firm*—Eckert Seamans Cherin & Mellott

[57] ABSTRACT

The magnetic resonance image of a specimen is encoded by the phase angle response of the volume elements in a slice or volume illuminated by a pulsed radio frequency source, instead of encoded by the magnitude response. The specimen can be imaged before and during intrinsic perturbations such as caused by external stimuli or execution of cognitive or motor tasks. Preferably the specimen is perfused with a paramagnetic contrast agent such as Gadolinium or Dysprosium, slowly or by bolus injection, after recording one or more baseline images. The phase angle response of the specimen can then be recorded one or more times as perturbation subsists or as the bolus traverses the area of illumination. Fast Fourier transformation converts gradient spin echo response data to phase angles for a spatial distribution of volume elements in the illuminated slice. The baseline phase angle image is subtracted from the image taken after the bolus injection, providing a high contrast image showing the concentration of the contrast agent. The change $\Delta\phi$ in phase angle between the images is proportional to the concentration of the contrast agent, enabling accurate measurements of localized blood volume and flow rate. The invention is particularly applicable to visualization of localized ischemia caused by cerebral vascular disease, such as stroke.

35 Claims, 10 Drawing Sheets

MAGNETIC RESONANCE IMAGING WITH CONTRAST ENHANCED PHASE ANGLE RECONSTRUCTION

BACKGROUND OF THE INVENTION

1. Field of the Invention

The invention relates to the field of magnetic resonance imaging for obtaining a graphic representation of biological samples and other materials, such as polymers, etc. (hereinafter, the "sample" or the "specimen"). In connection with graphic representation of tissue and the like, the invention provides a diagnostic tool for visualizing ischemia, infarction and other irregularities in cerebral and noncerebral tissues. However, the invention is useful for visualizing the microstructure of materials generally. More particularly, the invention employs phase angle reconstruction imaging techniques using paramagnetic contrast agents for improving the accuracy of the image data collected for each volume element in an image slice.

2. Prior Art

Magnetic resonance imaging is a non-invasive and non-destructive testing procedure whereby local variations in the electromagnetic properties of a specimen can be detected and displayed, for example, as variations in the luminance or color of pixels in an image. In general, magnetic resonance imaging involves applying bursts of radio frequency energy to a specimen positioned in a main magnetic field in order to produce responsive emission of electromagnetic radiation from hydrogen nuclei or other nuclei. The emitted signal is sampled over time after a predetermined time delay following an illuminating pulse, the time delay being chosen to highlight magnetically responsive atoms. The collected signal is digitized, producing a time domain representation of the specimen, typically through a plane or slice of predetermined thickness. By Fourier transform analysis the time domain representation is converted into a spatial representation of the slice, which is then displayed as an X-Y array of pixels. Whereas certain atoms contained in tissues are magnetically responsive at particular echo times and others are not, the resulting data can be used to distinguish between types of tissue, using the electromagnetic response of the tissue as the distinguishing parameter.

A plurality of slices can be recorded in this manner, for obtaining a three dimensional representation of the internal character of the specimen. The distinct magnetic properties of the tissues are mapped to identify variations in anatomical structures. For example, the iron content in blood renders the blood more susceptible to magnetization than surrounding tissues, providing a means by which vascular structures can be distinguished. There are many particular methods by which data collected in this manner can be analyzed to produce useful information, with better detail than can be obtained from ultrasound imaging, without subjecting the specimen to ionizing radiation, and without undertaking surgery.

The Fourier transform involves converting the in-phase and out-of-phase signal amplitudes as a function of time to complex signal intensity as a function of frequency, from which the magnitude of the complex signal is derived. The magnitude data may be displayed without enhancement, but enhancement is valuable for presenting the information in variations of luminance, saturation and/or hue corresponding to structural variations thereby detected in heterogeneous tissue or the like. A specific technique for spin echo magnetic resonance imaging is disclosed, for example, in U.S. Pat. No. 4,766,381—Conturo et al. Once the raw data is available in the form of amplitude samples, various techniques can be employed for extracting useful data. However, there are certain limitations in the data due to the interaction of fields produced in neighboring tissues, motion in the blood vessels, etc.

In connection with certain conditions, a magnetic resonance image can be analyzed by skilled persons to visualize the location, size and character of tumors, hematomas, infarctions and the like, due to the spatially discontinuous response of such structures and/or the blood flow in the region to a pulsed radio frequency signal. For example, a localized area of anemic tissue may occur in connection with an infarction, and be identifiable as distinct from healthy surrounding tissue. The localized area or the perimeter of the area is characterized by a different magnetic susceptibility as a result of accumulation or scarcity of paramagnetic elements as compared to the healthy tissue. In the area of an injury, breakdown products of blood may accumulate, including deoxyhemoglobin, methemoglobin, free ferric iron, hemosiderin and the like.

Magnetic susceptibility data for imaging tissues including paramagnetic elements can be obtained by measuring the amplitude of transverse magnetization that remains after a change is induced by an incident radio frequency field. The net transverse decay rate differs for different areas of heterogeneous tissue, as a function of the local concentration and distribution of paramagnetic material.

It is possible to increase the contrast of a magnetic resonance image by infusing a paramagnetic material which has a different distribution in the structure of interest than the distribution in adjacent structures. Use of an exogenous agent to improve amplitude contrast is disclosed, for example, in "Perfusion Imaging with NMR Contrast Agents," Rosen et al, 14 *Magnetic Resonance in Medicine* 249–265 (1990).

Paramagnetic infusion can be effected by slow intravenous injection of an accumulating paramagnetic material, or by faster injection of a quantity of the paramagnetic material (i.e., a bolus), which travels through the blood stream. By recording a plurality of magnetic resonance images both before and during the perfusion of the tissues with blood carrying the paramagnetic contrast agent, it is possible to obtain a baseline image which can be subtracted from or divided into the signal magnitude data representing an image recorded during perfusion, thereby substantially enhancing the contrast and the detail of the particular structure of interest.

Subtraction of a baseline image from an image recorded during perfusion with an x-ray absorptive agent is known in connection with angiography. See, e.g., the references mentioned in "Projectire Imaging of Pulsatile Flow with Magnetic Resonance," Wedeen et al, 230 *Science* 946–948 (1985). This article also discusses subtracting a baseline magnetic resonance complex image from a second image, the magnitude difference of which highlights moving elements (i.e., blood flow). The motion of the blood is detectable as magnitude signal changes which result from phase variation caused by the motion, producing a high contrast image of vascular structures. However, the article does not discuss the possibility of relating contrast agents to magnetic resonance phase mapping, particularly in connection with phase angle reconstruction and baseline phase angle subtraction.

Magnetic susceptibility-weighted magnitude magnetic resonance images can be used in conjunction with bolus injection of paramagnetic contrast agents to assess the effects of cerebral perfusion. By rapidly acquiring such images (including at the time of passage of the bolus), functional aspects of cerebral blood flow can be identified. With a bolus injection, the paramagnetic agent is confined to the vascular space during passage through the brain, and later becomes diffused through the tissues in the remainder of the body.

Within the blood vessel, a bulk magnetic field shift is produced due to the paramagnetic susceptibility of the contrast agent. Field gradients occur around concentrations of the agent, e.g., around blood vessels. In a particular volume element (or "voxel") of brain parenchyma from which an image pixel is derived, there are complex field inhomogeneities that are not all due to corresponding inhomogeneities in the tissue structure or to inhomogeneities in the externally applied static field. The variations in field gradients produce signal dephasing that degrades the magnitude reconstructed signal of a magnetic resonance image. The signal loss depends on the statistical distribution of fields within the voxel (e.g., Gaussian vs. Lorentsian), and thus depends on factors such as the size, density and heterogeneity of capillaries as well as temporal concentration changes, multiexponential $T_2$ decay, diffusion and other factors.

The present invention is directed to phase reconstruction of an image rather than magnitude (amplitude) reconstruction, and thus relies on the variation in electromagnetic phase response of different tissues. Bulk magnetic susceptibility variations from tissue to tissue and variations due to hyperfine electron-nuclear coupling are enhanced by introduction of a paramagnetic contrast agent. The contrast agent causes resonance frequency shifts and field-frequency offsets which are detected as phase shifts using a phase angle reconstruction of the sampled data, preferably with subtraction of baseline data collected either before introduction of the contrast agent or after the contrast agent has diffused to the point that local inhomogeneities have dissipated.

The net phase is relatively insensitive to the intravoxel field distribution, provided that the field distribution has a symmetric (e.g., statistical) profile, and thus can improve over results obtained in magnitude reconstruction, where many confounding factors contribute to signal dephasing. Paramagnetic-induced heterogeneities can be expected to induce different responses as to magnitude and phase, but the insensitivity of phase to at least some of these variations is such that phase reconstruction is believed to have better accuracy than magnitude reconstruction. Moreover, the phase images are better in a diagnostic setting, for example because the unaffected grey matter appears to have a more uniform brightness.

There are a limited number of examples where phase angle data has been collected for reconstruction of images representing variations in magnetic susceptibility. Such phase data has been used to image susceptibility variations which are endogenous to the brain, whereas the present invention provides a method by which phase angle reconstruction can be applied to exogenous paramagnetic enhancement, with favorable results as explained more fully hereinafter.

SUMMARY OF THE INVENTION

It is an object of the invention to improve the contrast and information content of a magnetic resonance imaging system by using susceptibility contrast enhancement via an exogenous paramagnetic contrast agent and baseline image subtraction.

It is another object of the invention to dynamically acquire phase angle images during bolus paramagnetic contrast injection in perfused cerebral or extracerebral tissues.

It is a further object to enable measurement of proportions of blood volume and tissue volume in a region of interest.

It is also an object of the invention to identify dependably certain cerebral and extracerebral conditions characterized by altered distribution of a paramagnetic contrast agent, including distinction between normal perfused tissues and abnormal tissues affected by stroke, ischemia, hematoma, infection, tumors and the like.

These and other objects are accomplished by a method and apparatus whereby a magnetic resonance image of a specimen is encoded by the phase angle response of the volume elements in a slice illuminated by a pulsed radio frequency source, instead of encoded by the magnitude response. The specimen is perfused with a paramagnetic contrast agent such as Gadolinium or Dysprosium, preferably by bolus injection, after recording one or more baseline images. The phase angle response of the specimen can then be recorded one or more times as the bolus traverses the area of illumination. Fast Fourier transformation converts gradient echo time response data to phase angles for a spatial distribution of volume elements in the illuminated slice. The baseline phase angle image is subtracted from the image taken after the bolus injection, providing a high contrast image showing the distribution of the contrast agent. The change $\Delta\phi$ in phase angle between the images being generally proportional to the concentration of the contrast agent, the invention enables accurate measurements of localized blood volume and flow rate. The invention is particularly applicable to visualization of cerebral vascular disease causing localized ischemia, such as stroke.

The baseline samples and the data samples can be collected repetitively over a range of different gradient echo parameters, with particular samples or combinations (e.g., averages) of the samples being chosen in order to maximize contrast in the phase angle differences.

A gradient echo sequence of any type can be used, as well as other pulse sequence methods which maintain phase shift in the setting of magnetic field changes (e.g., gradient echo planar, steady state free precession, miscentered RF spin echoes, etc.).

The paramagnetic contrast agent can be a Lanthanide series agent, such as Dysprosium (Dy) or Gadolinium (Gd).

In addition to generating a graphic map, blood volume and blood flow can be quantified absolutely or relatively from the functional relation between phase shift and concentration of the paramagnetic agent in a region of interest in the tissues, or since the phase angle differences $\Delta\phi$ are generally proportional to the concentration of the paramagnetic contrast agent carried in the blood, relative blood volume and relative blood flow can be quantified.

BRIEF DESCRIPTION OF THE DRAWINGS

There are shown in the drawings certain exemplary embodiments of the invention as now preferred. It should be understood that the invention is not limited to these examples, and is capable of variations within the scope of the appended claims. In the drawings.

FIG. 5b is a spin density weighted image at 5.2 hours at the same location as in FIG. 5a.

FIG. 5c is a corresponding image at an adjacent location, also showing the ischemic left caudate as seen in FIG. 5a.

FIG. 5d is a magnitude reconstructed $\Delta R^*$ image (as opposed to phase reconstructed), generated from the same data used to obtain FIG. 5a.

DETAILED DESCRIPTION OF THE PREFERRED EMBODIMENTS

Figure 1:
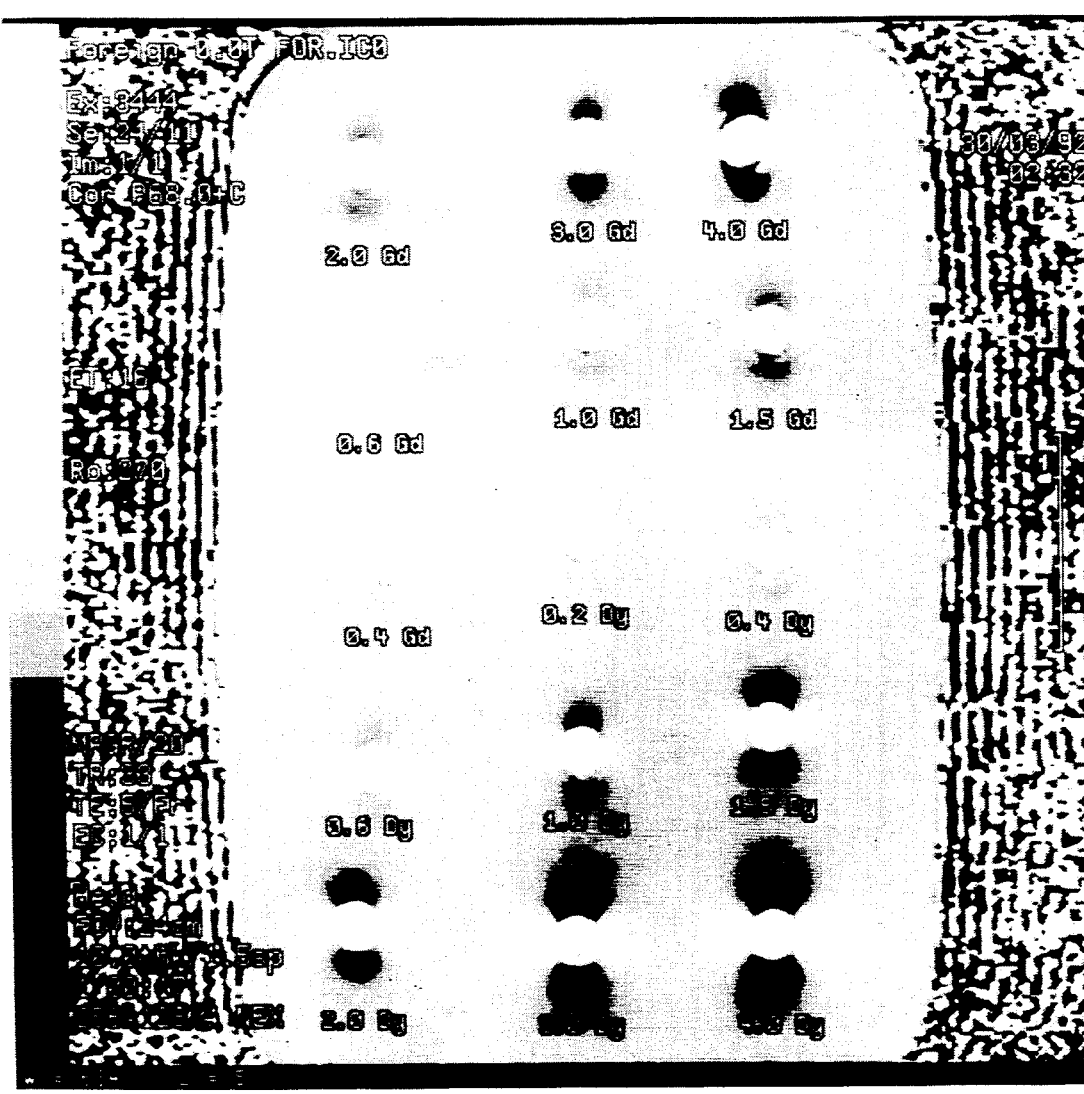
FIG. 1 is a magnetic resonance display image showing phase shift ($-\Delta\phi$) data for a phantom having tubes containing a paramagnetic contrast agent, surrounded by a solution.

A heterogeneously distributed paramagnetic agent causes a field inhomogeneity resulting in a signal loss in both gradient echo and spin echo magnetic resonance imaging. A paramagnetic agent can also cause a field shift resulting in a net phase shift in a gradient echo, or a miscentered spin echo. Depending on local conditions, paramagnetic contrast agents can be expected to have different effects on signal magnitude and phase angle. For the simple example of a heterogeneous paramagnetic distribution, both a phase shift and signal dephasing would be expected. If the same amount of agent is then homogeneously distributed, only a phase shift would occur. Both the bulk magnetization and the hyperfine coupling effects of contrast agents result in local phase shifts. Locally, the phase shifts are linearly proportional to the contrast agent concentration.

Just as nuclear magnetization is induced when a tissue sample is placed in a magnetic field, an electron magnetization is also induced by a paramagnetic sample placed in a magnetic field, or more precisely, a magnetic induction $B_0$ according to:

$$M = B_0 \chi_v \quad [1]$$

where M is the magnetization per unit volume, and $\chi_v$ is the unitless magnetic susceptibility of a unit volume of substance (also called $\kappa$ or volume susceptibility).

The induced magnetization adds to the main magnetic field such that the nuclear spins experience a net induction B given in c.g.s. units as:

$$B = B_0 + 4\pi M \quad [2]$$

If the susceptibility agent is compartmentalized and surrounded by a medium of much lower susceptibility, the frequency shift in the compartment is obtained from Equation [2], but with the right side multiplied by a factor F which is dependent on the geometry and orientation of the compartment. Accordingly, combining Equations [1] and [2] and letting $B = \omega/\gamma_I$, the frequency shift $\Delta\omega$ is given by:

$$\Delta\omega = 4\pi\omega_0 \chi_v F \quad [3]$$

where $\omega_0$ is the nuclear Larmor frequency in the absence of the paramagnetic component, and $\gamma_I$ is the nuclear gyromagnetic ratio. The phase shift can be given in terms of paramagnetic concentration by converting $\chi_v$ to the gram susceptibility $\chi_g$ according to $\chi_g = \chi_v/\rho$ where the density $\rho$ is in grams of paramagnetic substance per cm$^3$ of solution. This conversion is valid for paramagnetic solutions if the solutions are magnetically dilute, whereby electron spin-spin interactions are negligible. Multiplying both sides by the molecular weight $M_r$, one obtains $\chi_M = \chi_v/C_p$, where $\chi_M = M_r\chi_g$ is the molar susceptibility in cm$^3$/mol, and $C_p$ is the paramagnetic concentration in mol/cm$^3$. The local phase shift in the compartment is then obtained from Equation [3] as:

$$\Delta\phi_{bulk} = \Delta\omega 4\pi\omega_0 \chi_M F T_E C_p = P T_E C_p \quad [4]$$

where $T_E$ is the time in seconds between an RF pulse and the gradient echo, and P is the "phase activity" which is a property of the paramagnetic agent and the paramagnetic compartment geometry and orientation. For Gadolinium ("Gd(DTPA)"), an additional term is needed due to the susceptibility of the added cation according to Wiedemann's law of additivity. However, the cation diamagnetic susceptibility is at least three orders of magnitude smaller than the paramagnetic susceptibility of the Gd ion, and can be ignored. The underlying diamagnetism of the paramagnetic ion is also small and can be ignored. For a cylindrical paramagnetic compartment oriented perpendicular to the external field and surrounded by a diamagnetic medium, factor $F = -1/6$ as determined by a surface integral around the cylinder including the effects of the sphere of Lorentz.

For elements of the Lanthanide series such as Dysprosium (Dy) and Gadolinium (Gd), the susceptibility is given by:

$$\chi_M = \frac{N g_e^2 \beta_e^2 J(J+1)}{3kT} + f(J) \approx \frac{N \mu_{eff}^2}{3kT} \qquad [5]$$

where N is Avogadro's number, the electron Lande g-factor $g_e=2.002322$, $\beta_e$ is the electron Bohr magnetron, k is the Boltzmann constant, T is the absolute temperature, and $\mu_{eff}$ is the effective magnetic moment. In Equation [5], $J=|S+L|$ with S and L being the spin and orbital angular momentum vectors, respectively, and where f(J) is a complicated but known function of J. (See, e.g., Mulay, L. N., *Magnetic Susceptibility*, Interscience, New York, 1963; VanVleck, J. H., *Electric and Magnetic Susceptibilities*, Oxford University Press, London, 1932).

Factor $\mu_{eff}$ is 10.6 Bohr magnetoms for $Dy^{+3}$, which is larger than the $Gd^{+3}$ moment of 7.94 Bohr magnetoms even though $Gd^{+3}$ has seven unpaired electrons (S=7/2), compared to five for $Dy^{+3}$ (S=5/2). This discrepancy is due to the significant magnetic moment of the paired electrons in the Dy f orbitals.

In addition to the macroscopic effect of the bulk electron magnetization M on the nuclear spin, an additional microscopic magnetic interaction may be caused by the coordination complex between water and the paramagnetic ion. For nuclear and electron spin angular momentum vectors I and S, and a hyperfine coupling tensor A, the hyperfine interaction is given by I.A.S, from which a frequency shift can by derived. Because ions in solution tumble rapidly relative to the proton Larmor frequency, the directionality of hyperfine coupling is averaged and the coupling is given by AI.S, where A is the scalar hyperfine coupling constant. For paramagnetic ions, the hyperfine coupling is modeled as a Fermi contact interaction between the coordinated water and the ion, which causes the protons of complexed water to experience an accelerated Larmor frequency $\omega_M$. In paramagnetic solutions where the residence time $\tau_M$ of the water complexed to the paramagnetic ion is short compared to $\omega_M^{-1}$, the hyperfine phase shift can be derived to be:

$$\Delta\phi_{hyper} = \omega_0 \left(\frac{A}{\hbar}\right) \frac{g_e \beta_e J(J+1)}{3kT\gamma_I C_{water}} T_E C_p \qquad [6]$$

where the water concentration is $C_{water}=55M$ and there is one water coordination site per ion. Hyperfine shifts for water coordinated to free unchelated transition metals are known to be relatively small.

For a bolus injection of paramagnetic agent into a peripheral intravenous line, the magnetization M in Equation [1] is established immediately upon passage of the bolus into the magnet bore because the electron $T_1$ is in the microsecond range. As the bolus distributes into the cerebral microvasculature, the paramagnetic concentration $C_p$ (see Equation [4]) will vary with vector position r within the voxel. The paramagnetic "compartment" in this case can be considered to be the microscopic intravascular space. Alternatively, the paramagnetic compartment can be considered on a more macroscopic scale, e.g., as the grey matter, in which there is a heterogeneous concentration distribution due to vascular compartmentation. Analysis of the magnetization in the latter macroscopic compartment model would involve both a surface integral over the grey matter border and a volume integral over the internal heterogeneity. In experimental data, no significant detectable macroscopic field perturbations have been found in non-perfused tissues adjacent to perfused tissues. Therefore, the former microscopic model treating the intravascular space as the compartment is used as a first approximation. The factor F (in Equation [4]) may then vary with location r, depending on vessel shape and connectivity.

Assuming that the susceptibility effect dominates, the frequency at position r is given by $\Delta\omega(r)=4\pi F(r)\chi_V(r)\omega_0$ from Equation [3]. To determine the total voxel phase, it can be shown that the observed voxel phase is equal to the average voxel phase if the contrast agent induces a symmetric distribution of resonance frequencies within the voxel or if the induced intravoxel phase variation is small. From water spectra obtained during bolus injection, the former symmetry assumption was found to be valid. It is also assumed that the magnitude of the individual signal vectors is not heterogeneously affected by the contrast bolus. The latter assumption is valid for Dy, which causes no local dipole-dipole $T_2$ relaxation, and is valid for cases where resonance frequencies are not shifted out of the RF excitation bandwidth. Under these assumptions, the total voxel phase shift is then:

$$\Delta\phi_{vox} \approx \frac{\int_{vox} \Delta\phi(r)dr}{\int_{vox} dr} = \frac{T_E}{V_{vox}} \int_{vox} \Delta\omega(r)dr = \frac{4\pi\omega_0 T_E}{V_{vox}} \int_{vox} F(r)\chi_V(r)dr \qquad [7]$$

where $V_{vox}$ is the voxel volume and the integrals are over the entire volume. As $\chi_V = \chi_M C_p$, $$\Delta\phi_{vox} \approx \frac{4\pi\omega_0 \chi_M T_E}{V_{vox}} \int_{vox} F(r) C_p(r) dr. \qquad [8]$$

The last step in Equation [7] assumes that the only locations that contribute to a net phase shift are intravascular. However, it is possible that water exchange across the blood brain barrier might lead to net extravascular frequency shifts. Such exchange is expected to extend the frequency-shifted volume while reducing the intravascular frequency shift to the same extent so that the net phase shift would be unaltered and reasonably predicted by Equation [8]. In the brain in the presence of an intact blood brain barrier, the contrast agent concentration is zero in the extravascular space. Therefore, the only locations r which contribute to the integral in Equation [8] are within the intravascular volume $V_{vasc}$.

Assuming that the paramagnetic concentration is uniformly distributed within the intravascular space of the voxel, Equation [8] becomes:

$$\Delta\phi_{vox} \approx \frac{4\pi\omega_0 \chi_M T_E C_{vasc}}{V_{vox}} \int_{vasc} F(r)dr, \qquad [9]$$

where the integral is over the intravascular space. Multiplying Equation [9] by $V_{vasc}/\int_{vasc} dr$ yields the conclusion that the phase shift is proportional to the concentration of contrast agent and to the regional cerebral blood volume (hereinafter abbreviated "rCBV"):

$$\Delta\phi_{vox} \sim 4\pi\omega_0 \chi_M T_E C_{vasc} \langle F \rangle_{vasc} rCBV, \quad [10]$$

where the regional cerebral blood volume $rCBV = V_{vasc}/V_{vox}$ and $F_{vasc}$ is the average factor F for the vascular compartment. The cerebral capillary rCBV is only about 2% of the tissue volume, and the total intravascular rCBV is about 4%. The product $rCBV \cdot C_{vasc}$ is equivalent to the tissue concentration $C_{tissue}$. If the concentration is not equilibrated within the intravascular space of the voxel, phase shifts would be better represented by the full integral in Equation [8]. It is also possible that the intravascular voxel system can be described by a single factor F, such as might occur for a continuous, interconnected, patent capillary bed. In this case, $\Delta\phi_{vox} \sim 4\pi\omega_0 \chi_M T_E C_{vasc} F \cdot rCBV$ from Equation [8], where $C_{vasc}$ is the average concentration within the vasculature.

Equation [10] should be treated as a working hypothesis derived to predict the phase shift in the absence of exchange given knowledge regarding capillary geometric factors F and intravascular concentration. This expression is meant to also predict the phase shift in the presence of exchange, although this hypothesis remains to be proven. Equation [10] can be considered to be a hypothetical analogue to the expression for simple homogeneous solutions, with the factor F accounting for compartmentalization, vascular architecture and possibly diffusion, exchange across the blood brain barrier, and other factors. Finally, it is noted that the contrast agent will only be distributed in the plasma volume rather than the blood volume, which might affect F and which should be taken into account when assessing absolute rCBV.

The foregoing discussion presents a number of possibilities whereby introducing an exogenous contrast agent and mapping the detected phase angle of an array of volume elements in an RF illuminated slice can result in useful information. This information includes but is not limited to detecting the presence of vascular diseases that are detectable by revealing differences in magnetic susceptibility between adjacent perfused tissues. For example, local blood volumes and flow conditions can be assessed from the reflection of these parameters in the phase angle data collected.

A number of examples of experiments demonstrating application of the invention follow. In a first test, magnetic resonance imaging was applied to a phantom or inanimate test structure in order to quantify and compare the effect of contrast agent concentration on the theoretical bases discussed above. In additional tests, images were collected in vivo from experimental animals. For all experiments, either Gd(DPTA) (available from Berlex, Wayne N.J.) or Dy(DTPA-BMA) (Salutar, Inc., Sunnyvale Calif.) were used as contrast agents.

A phantom containing various concentrations of both agents was made to measure effects of concentration on phase shift. Test tubes (11 mm I.D.; 13 mm O.D; 54 mm length) were oriented vertically by gluing the base of the tubes to a plastic basin. The test tubes and basin were filled with a 0.2 mM $MnCl_2$ solution chosen because the $T_1$ and $T_2$ values approximate those of brain matter, and the solute is relatively resistant to oxidation-reduction reactions. The phantom was imaged at 19.3° C. using a Signa superconducting 1.5 T system (General Electric, Milwaukee Wis.) using a coronal gradient echo sequence at a variety of $T_E$ intervals. The phantom was withdrawn and stock paramagnetic contrast agent solutions were injected into the appropriate tubes to produce concentrations ranging from 0.2 to 4.0 mM.

Air bubbles were removed, the phantom was advanced to the position of the previous imaging and post-contrast data were acquired using the same transmitter, receiver and shim settings as the pre-contrast data. From the slope of the phase shift rs. concentration and $T_E$, the phase activity was measured and applied according to Equation [4] above to extract the factor $\chi_M$, assuming no hyperfine contribution and using $F = -1/6$ as appropriate for a cylindrical tube orthogonal to the incident field $B_0$. Whereas phase subtraction was used, the analysis is valid even for paramagnetic material outside the sample tube.

Use of the invention for imaging biological tissues was also undertaken to demonstrate its effectiveness, using three baboons. Magnetic resonance images were obtained through the basal ganglia of two of the baboons after unilateral partial middle cerebral artery occlusion using a 2.7-French microcatheter (900 μm O.D.). The experiment was intended to simulate aspects of a stroke in humans, and protocol approval was obtained from the Johns Hopkins Institutional Review Board.

In the first animal, 0.6 mmol/kg of 500 mM Dy(D-TPA-BMA) was bolus injected 5.1 hours after partial occlusion. In the second animal, 0.3 mmol/kg of 500 mM Gd(DTPA) was bolus injected 1.4 hours after partial occlusion. In a third baboon, 0.3 mmol/kg of 500 mM Gd(DTPA) was bolus injected after complete occlusion of the middle cerebral artery and anterior cerebral artery attained by endovascular injection of N-butyl cyanoacrylate adhesive.

The baboons were anesthetized with Saffan 0.5 ml/kg prior to occlusion, followed by a continuous intravenous pentobarbital drip at 5 mg/kg/hr, which has a minimal effect on cerebral blood flow. Robinal was administered to reduce pulmonary and salivary secretions, and the animals were paralyzed with Pavulon and mechanically ventilated. Arterial pressure, heart rate, EKG, oxygen saturation, $pCO_2$ and rectal temperature were monitored continuously. Blood pressure was maintained using saline volume expansion, which does not affect blood brain barrier permeability.

The animals where positioned such that a slice normal to the incident field $B_0$ provided an anatomic coronal image. The same gradient echo sequence was used as in the phantom study, with a $T_R/T_E$ of 33/22 in milliseconds, $\alpha = 20°$, no signal averaging, a $256 \times 128$ matrix (4.5 sec/image), a 1 cm slice thickness, and a 24 cm field of view ($0.9 \times 1.9$ mm voxels). Flow compensation gradients were not used.

After three baseline image acquisitions, either Dy(D-TPA-BMA) or Gd(DTPA) were directly bolus-injected into the left ventricle at approximately 5 cc/sec via a femoral artery catheter. Additionally, radioactive microspheres 16 μm in diameter were injected to enable regional blood flow measurement. The baboons weighed between 16 and 18 kg, and injected volumes were approximately 20 ml for Dy and 10 ml for Gd. The 0.6 mmol/kg Dy dose is expected to have a susceptibility effect 3.6 times that of the 0.3 mmol/kg Gd dose, however this dose of Gd(DTPA) was chosen because it is the highest dose approved for investigational patient studies at the institution. Paramagnetic Lanthanides are used in the examples. Other agents having diamagnetic, ferromagnetic and/or superparamagnetic properties are also possible.

Individual phase angle images were reconstructed on a Sun-4/Sparcstation computer network by zero-filling the raw data to 256 points before performing a two dimensional fast Fourier transform. Baseline phase shifts occur in the absence of paramagnetic agent due to off-resonance effects, eddy currents, static and RF field inhomogeneity, flow along imaging gradients, chemical shift, natural brain paramagnetic content, echo miscentering and other factors, preventing direct measurement of the phase shift $\Delta\phi$ from the N individual phase angle images. To correct for these effects, $\Delta\phi$ images were generated according to $\Delta\phi_{n-1}=\arg(Z_{n-1})$, where $Z_{n-1}=Z_n/Z_1$ with $Z_n$ being the complex signal for the n-th image acquisition and $Z_1$ the signal for the first pre-contrast acquisition. Complex signals were regenerated from the individual phase angle images assuming unit magnitude. This complex arithmetic approach is known for field inhomogeneity mapping (See, Weisskoff, R. M. and Kiihne, S., *Magn. Reson. Med.* 24, 375–383 (1992) and Yeung, H. M. and Kormos, D. W., *Radiology* 159, 783–786 (1986)), and also for velocity imaging (Conturo, T. E. and Robinson, B. H., *Magn. Reson. Med.* 25, 233–247 (1992)). The technique produces robust phase correction. The average phase shift for the imaging series was calculated as $\Delta\bar\phi=\Sigma_{i=1}^{N-1}\Delta\phi_i/(N-1)$. i/(N−1). If several baseline acquisitions are made and averaged (e.g., to improve signal to noise ratio), the average precontrast phase should be calculated as $\phi_{pre}=\arg Z_{pre}$, where $Z_{pre}=\Sigma_{i=1}^{M}Z_i/M$, and there are M precontrast acquisitions. The average phase calculation from the average complex signal is not previously known. The average baseline phase is calculated in this manner to prevent cancellation artifacts that would occur in the latter case due to slight positional shifts in any borders of phase wraparound. For comparison with the collected phase data, $\Delta R^*$ magnitude images were also extracted, using $\Delta R^*_{n-1}=-\ln(I_n/I_1)/T_E$, where I is the signal magnitude.

Figure 2A:
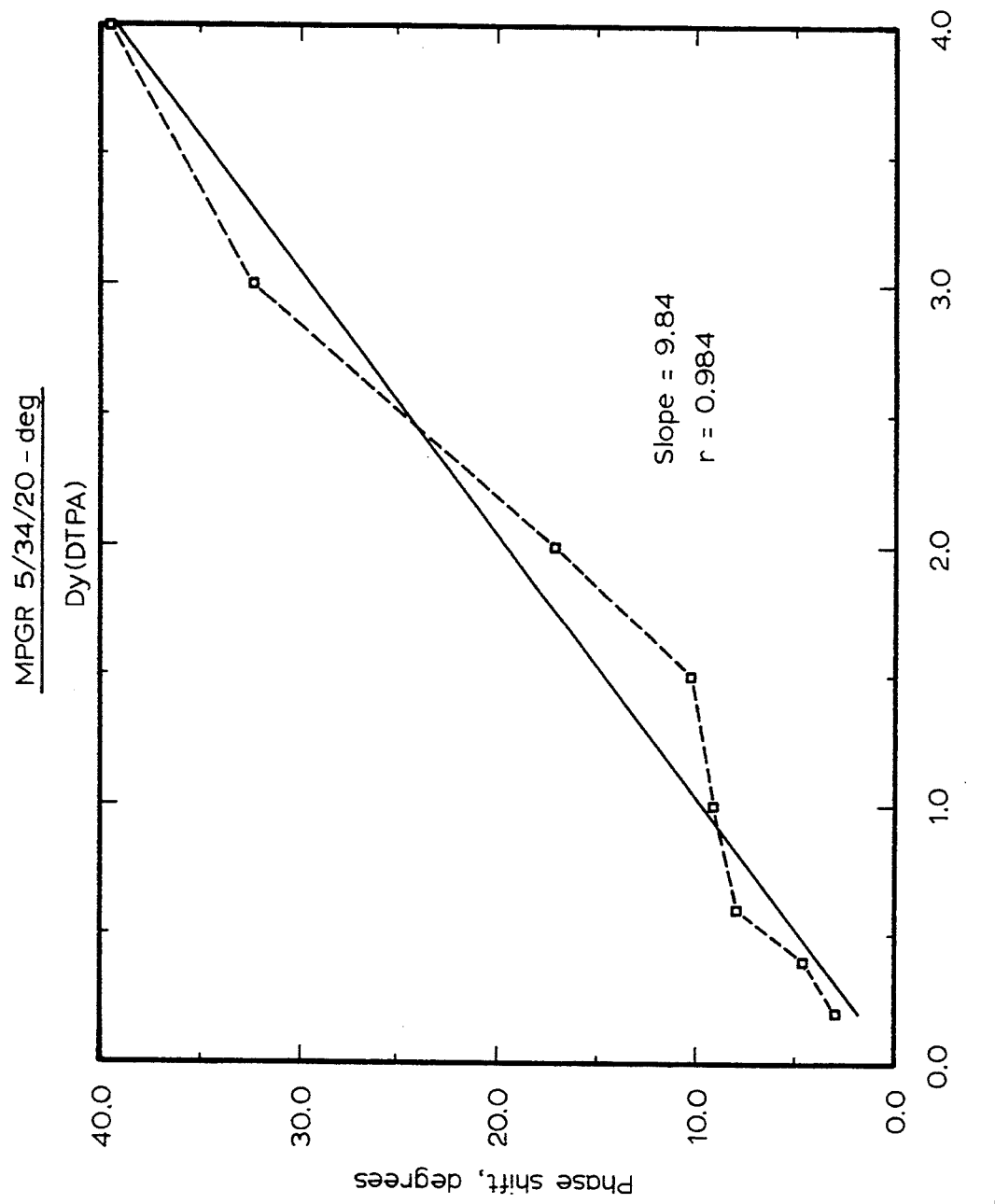
FIG. 2a is a graph of phase shift vs. concentration of paramagnetic agent Dy(DTPA) developed from the data shown graphically in FIG. 1.
Figure 2B:
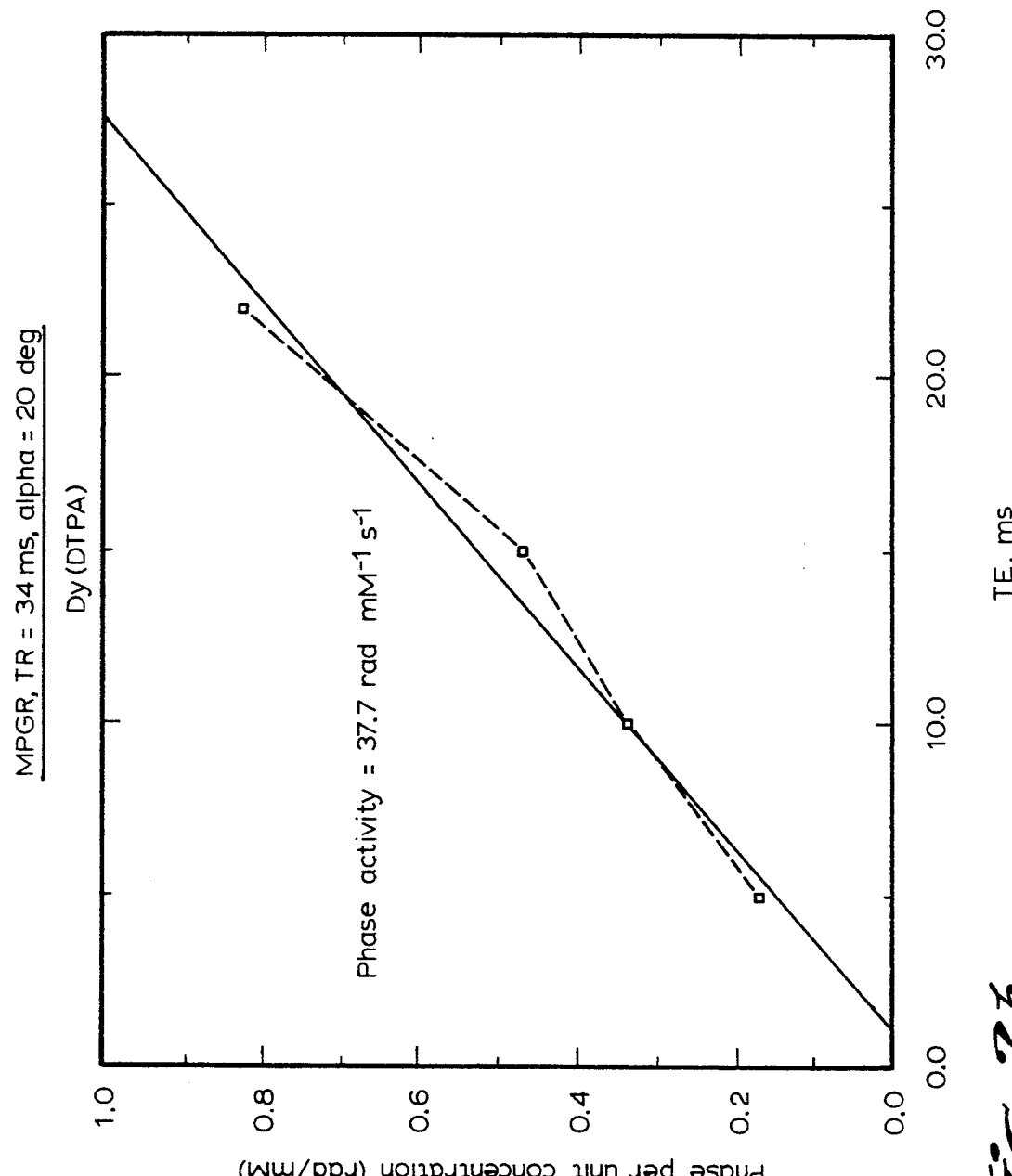
FIG. 2b is a graph of phase angle per unit of paramagnetic concentration vs. echo time TE, also developed from the data of FIG. 1 and from analogous data collected at different TE values.

The images collected are shown by the photographs in FIGS. 1, 3a–3b and 5a–5d. The $-\Delta\phi$ image for the phantom is shown in FIG. 1a, where the negative phase shift is shown such that the solutions in the tubes (having a higher paramagnetic concentration) appear bright. The phase shift in the tube is assigned as negative as it is known that the field change in the $\pm Z$ direction outside the sample tube should be positive. The resulting calibration curve relating phase shift to concentration of paramagnetic contrast agent as shown in FIG. 2a is generally linear, with deviations from linearity apparently caused by field effects from adjacent tubes. The variation in slope as a function of $T_E$ as shown in FIG. 2b represents the phase activity which is described mathematically in Equation [4] above.

From the phase activity as shown, the molar susceptibility $\chi_M$ is calculated from Equation [4] to be $4.5\times10^{-2}$ cm$^3$/mol, which is consistent with the value of $4.8\times10^{-2}$ cm$^3$/mol reported in the literature and also as calculated from Equation [5] at 19.3° C. These results suggest that the bulk susceptibility effect dominates the effect of hyperfine coupling in the application of contrast agents to phase imaging.

The field perturbations that occur around the tubes result in field gradients, which would presumably also occur around capillaries. These gradients are one of the sources of signal loss in magnitude images, due to dephasing and other effects as mentioned above. The extra-compartmental fields average to zero for simple geometries (See FIG. 1a) and might also be expected to average to zero around more complex compartments such as capillaries. As it can be shown that the phase angle samples the average field under certain conditions, the extra-compartmental fields thus do not confuse the image by causing additional phase shift.

Figure 3A:
FIG. 3a is an image through the basal ganglia of a baboon at 5.1 hours after partial occlusion of the middle cerebral artery, representing the average of a number of phase difference images prepared according to the invention and immediately following bolus contrast agent infusion.
Figure 3B:
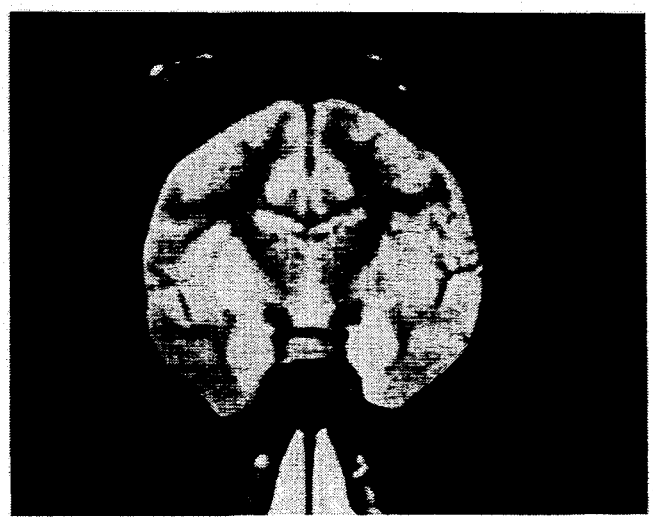
FIG. 3b is an image corresponding to FIG. 3a, showing the spin density weighted signal magnitude image at 5.5 hours after occlusion, a region of eventual infarct being identifiable in the right putamen.

For the partial occlusion study using bolus injected Dy(DTPA-BMA) in baboons, individual phase angle images were collected prior to injecting the contrast agent. These phase angle images have significant baseline phase errors including focal phase shifts in the basal ganglia due to iron content. It is possible to correct for baseline phase inhomogeneities by phase subtraction. The subtracted phase is zero within the image noise. FIG. 3a shows the average of all the subsequent baseline-corrected difference images recorded after the bolus had distributed throughout the brain. The phase shift in perfused tissues is positive as verified by imaging phantoms using the same pulse sequence and imaging plane. The subsequent subtracted images provided high spatial resolution and are characterized by anatomically correct grey and white matter differentiation. FIG. 3b is a spin density weighted image which compares closely with the results of the quite clear baseline-corrected average phase angle map of FIG. 3a.

Referring to FIG. 3a, the images recorded show a decreased phase shift in the right putamen, which is ischemic due to the occlusion of cerebral blood circulation. Along the surface of the brain, the phase shift was especially high, which is believed to be due to leptomeningeal/surface cortical circulation. High phase shifts also occur in the regions of the third and lateral ventricles, indicating probable choroid plexus.

The general contrast was reproducibly seen in images recorded for the two other baboons, as discussed below. The maximum observed putamen phase shift of 65° that occurred during the first pass of the contrast bolus corresponds to a frequency shift of 8 Hz or 0.12 ppm, which is much less than the fat/water chemical shift of 235 Hz and is well within the bandwidth of the RF pulse (>1 kHz).

The apparent preservation of resolution in FIG. 3a indicates that resolution was not significantly degraded by macroscopic field gradients between adjacent tissues. The high resolution also indicates that resolution is not significantly affected by changes in concentration and phase that occur during the time in which the respective images are acquired. For a linear concentration change between phase-encoding steps, the reconstructed phase for each pixel will be the average of the phase during the image acquisition. A linear concentration change is assumed, which will best be true in the case of rapid acquisitions and for images acquired during the falling phase of the concentration-time curve. A linear concentration change would also be expected to cause small misregistration along the phase-encoding direction, as occurs in flow misregistration artifacts. If the contrast-induced phase shift accumulated during the k-space acquisition is $2\pi$, the signal will be misregistered by one pixel width. If the phase shift is not linear, the effect on the image is a convolution of the Fourier transform of the concentration-time curve and the uncontrasted image, the result of which may be a blurring of the image. In these experiments the maximum linear misregistration artifact in grey and white matter is predicted to be much less than a pixel width because the largest phase shift between successive images was about 35° (see below).

Figure 4A:
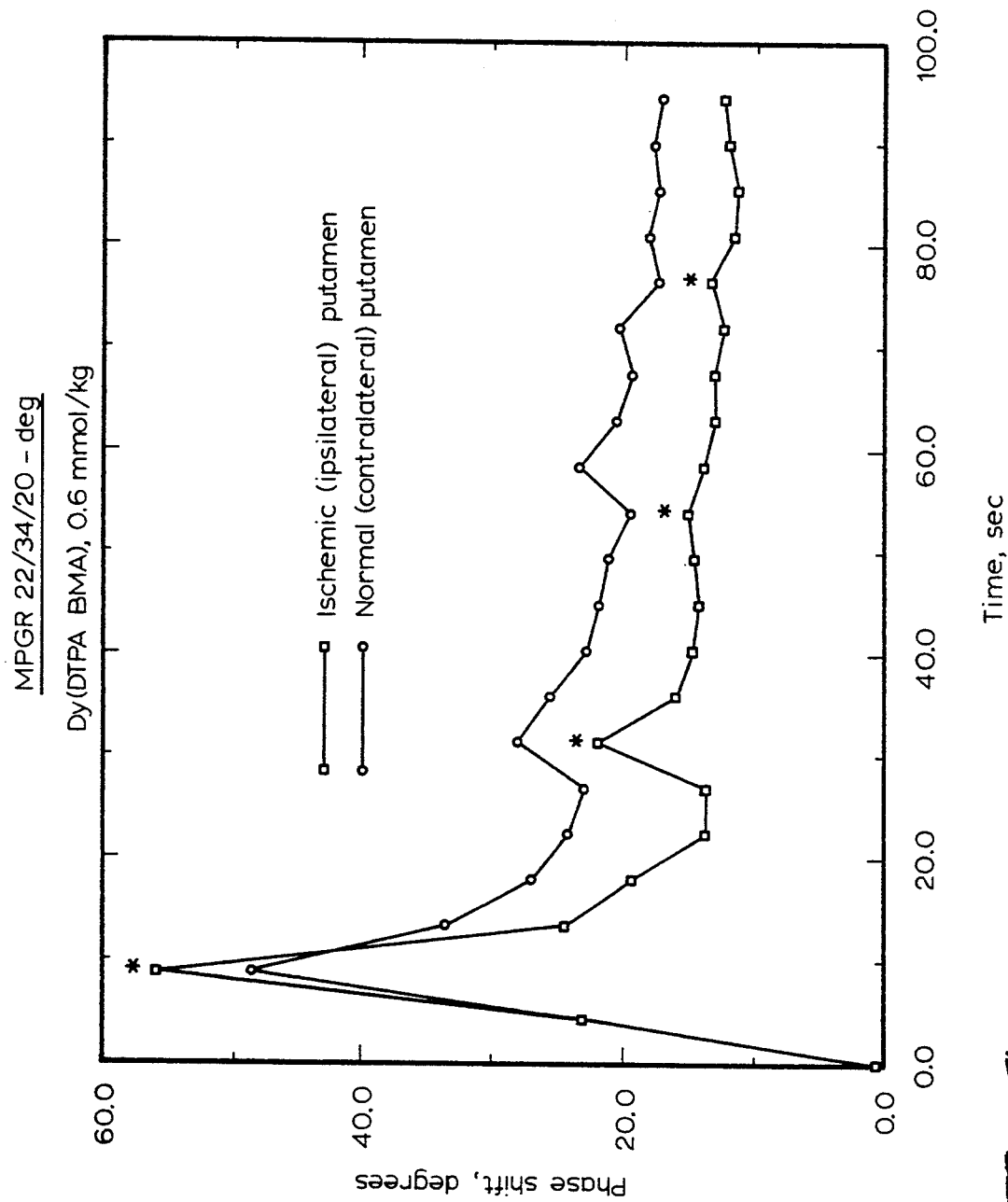
FIG. 4a is a graph comparing phase shifts detected in the ipsilateral putamen and the contralateral putamen as a function of time, following bolus injection of Dy(DTPA-BMA) at time zero, a decreased phase shift being shown in the ischemic putamen as compared to the normal putamen.
Figure 4B:
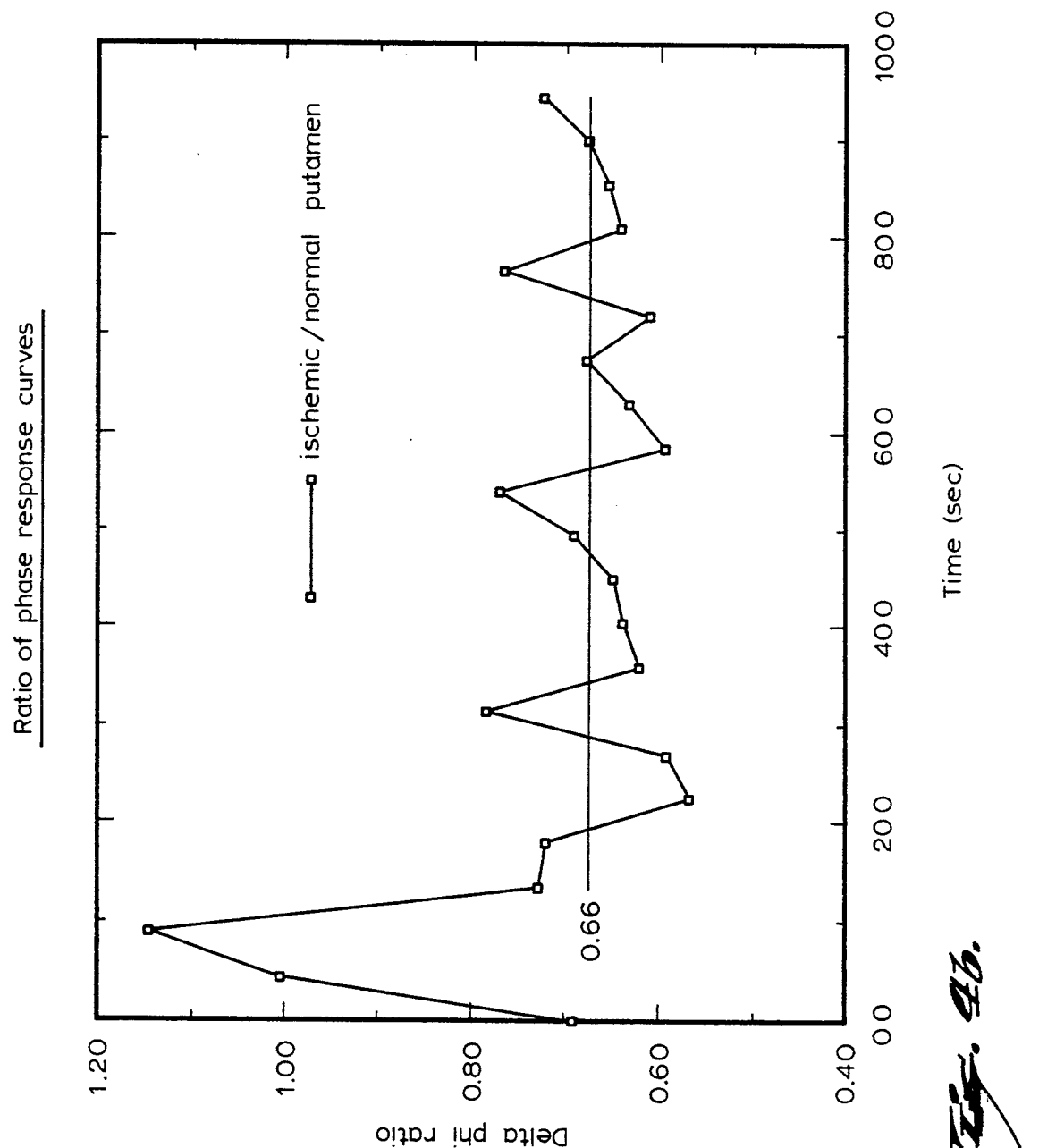
FIG. 4b is a graph of the ratio of the ischemic region phase shift to the normal region phase shift over time.

Quantitative region of interest (ROI) data from the ischemic and normal putamena were obtained from the individual $\Delta\phi$ images (FIGS. 4a and 4b). The ROI's were located to avoid any macroscopic field gradients that might occur around large vessels. The $\Delta\phi$ curves appear to approximate what would be expected for a concentration-time curve. The effects of recirculation of the bolus are clearly demonstrated by peaks that occur every 23 seconds, which is on the order of a mean body recirculation time of 32 seconds expected for a baboon (calculated from a nominal total blood volume of 8–10% of body weight, and a cardiac output of 0.19 L/min/kg). The difference between the observed and calculated recirculation times may be due to the relatively high heart rate in the test subject (180 BPM) compared to nominal (130–160 BPM), or differences in the transit times of the cerebral and extra-cerebral circulation.

The rapid fall after the initial peak in FIG. 4a is due to passage of the bolus out of the brain, and the subsequent slow decay is due to equilibration of the contrast agent into the peripheral extracellular space. The slow peripheral equilibration should equally affect the concentration in the two sides of the brain because the contrast agent equilibration into the cerebral intravascular space is much faster than equilibration into the peripheral extracellular fluid space. The latter slow decay is correctable by taking the ratio of the ipsilateral and contralateral putamen curves, whereupon the least squares fit to the latter portion of the curve is level with a value of 0.66 as shown in FIG. 4b. From Equation [10], this ratio can be shown to represent the relative rCBV, assuming that the intravascular Dy concentration in the two putamena are equal. This result suggests that the ischemic putamenal blood volume (i.e., the rCBV) was reduced by the occlusion in the amount of 33%. The periodicity in the ratio curve is probably due to differences between the right and left concentration caused by slight right/left asymmetry in the carotid and middle cerebral artery systolic waves.

The corrected phase mapping data can be used to produce an image of relative regional cerebral blood volume (rCBV) for comparative analysis. Assuming that a linear relation between $\Delta\phi$ and tissue concentration exists (as represented by Equation [10] and reflected by the phantom data), the integral of the phase-time curve of FIG. 4a is proportional to local tissue blood volume as in tracer kinetic analysis. Curve-fitting of the first peak in the curve is not needed for two reasons: first, inasmuch as the phase-time curve in FIG. 4a includes data from several recirculations, the primary and recirculation decay curves are completely sampled and averaged. The area under the curves in FIG. 4a thus represents the weighted-average relative rCBV for the primary and recirculation passes, with very small errors caused by incomplete sampling of the small late recirculation curves. Secondly, regional cerebral blood flow (rCBF) was not calculated, and thus the relationship between the shapes of the input function and the first peak-decay curve need not be assessed. The relative integral values were obtained using ROI's of the averaged $\Delta\phi$ image in FIG. 3b, which estimates that the ischemic putamenal blood volume was reduced by 32.7% relative to the contralateral putamen. This measurement is in excellent agreement with the 33% rCBV reduction determined from the ratio curves. These data also suggest that the tissue phase shift is approximately linear with respect to concentration. For example, if the phase shift were quadratically related to concentration, the least squares fit in FIG. 4b would slope upward and the area under the curves in FIG. 4a would indicate a much greater reduction in rCBV compared to that estimated from the latter portion of the ratio curve in FIG. 4b. For comparison, the rCBF measured in the ischemic putamen was reduced by 50% relative to the contralateral putamen as determined from relative putamen microsphere counts obtained after sacrifice. The ischemic putamenal region seen in the image subsequently exhibited a spin density-weighted signal change at a later time (FIG. 3c). The calculated 33% reduction in rCBV is consistent with the measured 50% rCBF reduction as it is known that rCBV is increased in low-grade ischemia as a compensatory mechanism to maintain rCBF. For higher grades of ischemia, this compensatory capacity is exhausted and both rCBV and rCBF fall, although the relative decrease in rCBF from normal levels characteristically exceeds that of the rCBV decrease due to relative vasodilatation and elevated mean transit time (MTT), where MTT=rCBV/rCBF.

The ratios between the estimated blood volumes for the normal putamen versus adjacent internal capsule and for the parietal cortical grey matter versus the adjacent white matter were measured to be 1.81 and 1.84, respectively, in good agreement with the approximate two-fold higher blood volume of grey matter relative to white matter observed in humans.

Figure 5A:
FIG. 5a is an image obtained after bolus injection of Gd(DTPA) 1.4 hours after partial occlusion of the middle cerebral artery in a further specimen baboon.
Figure 5B:
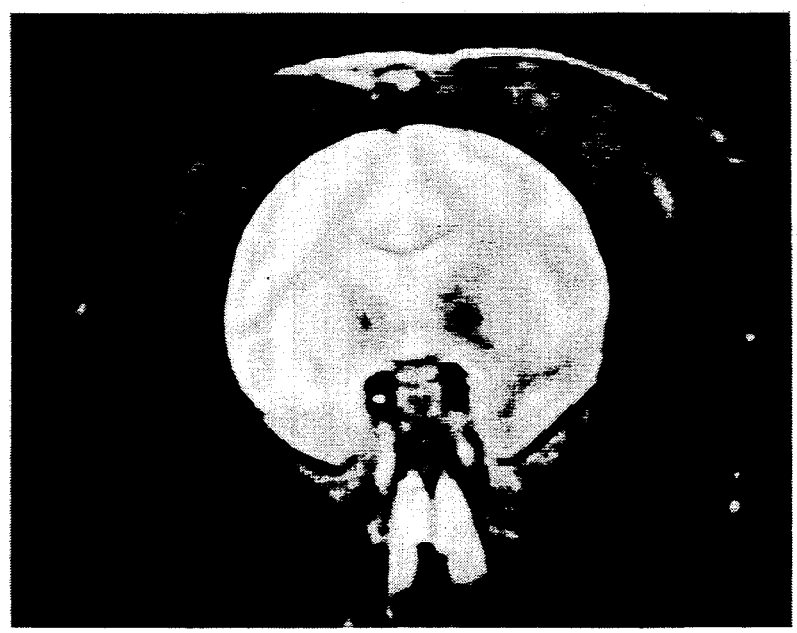
Figure 5C:
Figure 5D:
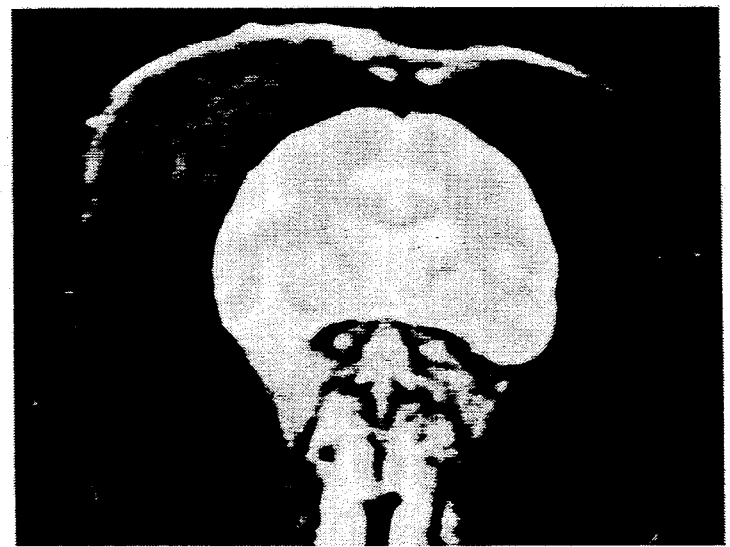

In the second experiment using Gd(DTPA), the $\Delta\phi_{5-1}$ image in the series showed a significant ($\sim 65\%$) reduction in phase shift in the acutely ischemic caudate nucleus relative to the normal side (see FIG. 5a). This was the only image in the series which demonstrated significant phase shifts in normal grey and white matter, so blood volumes were not estimated. The phase shifts in FIG. 5a were generally about 25° in the basal ganglia grey matter and about 150° at the cortical surface, and image contrast correlates with that of the spin density weighted image acquired at the same location (FIG. 5b). A spin density-weighted signal abnormality later occurred in the slice immediately adjacent to the region of reduced caudate phase (FIG. 5c).

In the third experiment involving complete middle and anterior cerebral artery occlusion with N-butyl cyanoacrylate adhesive, the phase shift of the involved hemisphere was uniformly zero within phase noise indicating absence of perfusion. This result was later verified by the microspheres. The ipsilateral phase was zero even in regions immediately adjacent to the perfused hemisphere (image not shown), suggesting that the bulk magnetization of perfused tissues does not cause significant field perturbations in surrounding tissues. In all three experiments, the areas of blood volume reduction seen on the $\Delta\phi$ images progressed to histologically-proven infarction.

Figure 6:
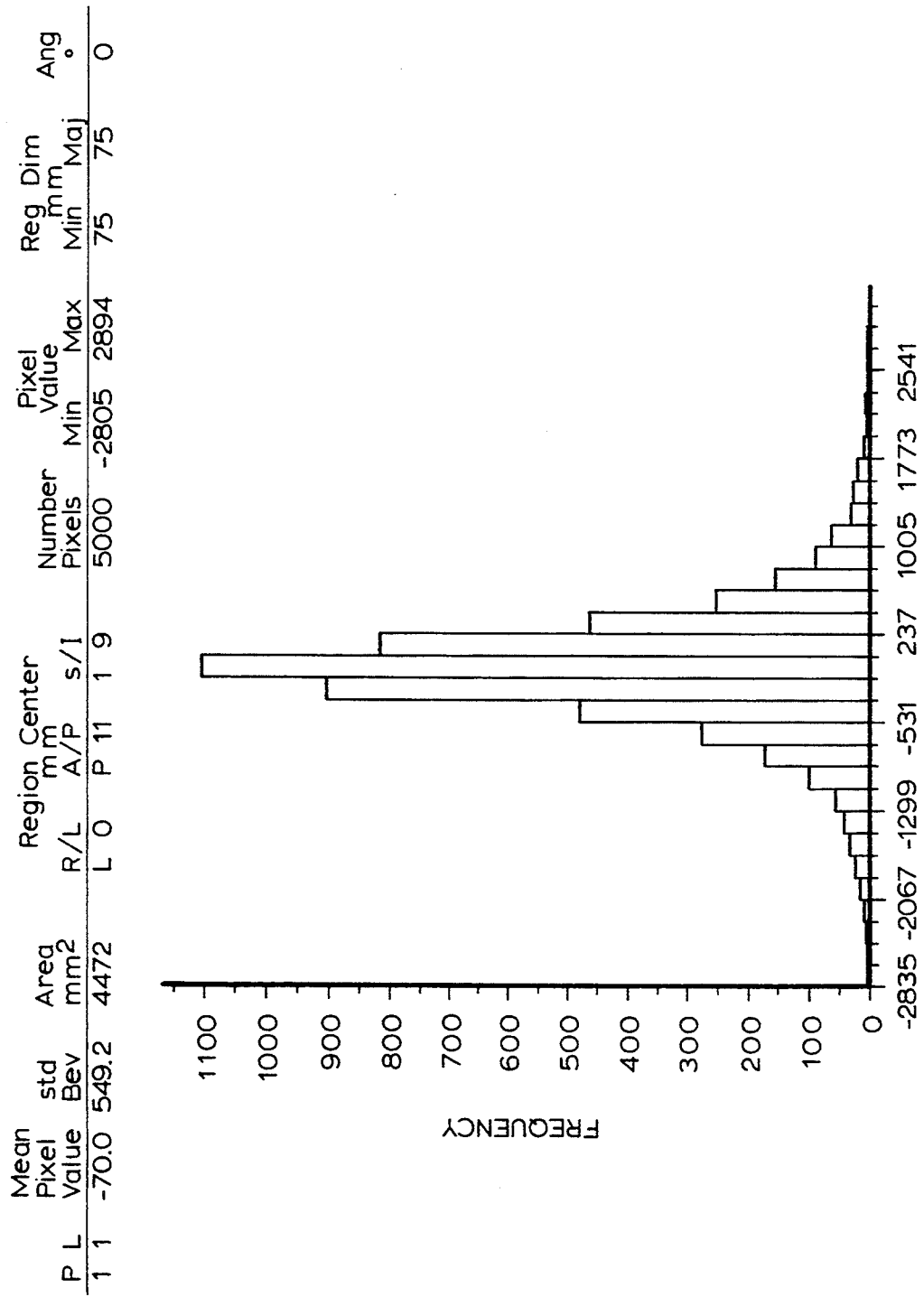
FIG. 6 is a histogram comparing the relative signal to noise ratio of phase difference according to the invention and known magnitude reconstructed $\Delta R^*$ images.

For evaluation of the relative signal-to-noise ratio (SNR), images were magnitude-reconstructed and the change in transverse decay rate ($\Delta R^*$) was calculated. In the second animal, the ischemic caudate nucleus does not appear abnormal in the $\Delta R^*_{5-1}$ image (FIG. 5d) compared to the $\Delta\phi_{5-1}$ image (FIG. 5a). The relative SNR ratio for the $\Delta\phi$ and $\Delta R^*$ methods was calculated on a pixel-by-pixel basis from the averaged images in the first experiment (FIG. 3a) using theoretical signal to noise expressions derived in terms of the pre- and post-contrast signal intensities. A histogram was obtained from a whole brain ROI of the resulting "relative SNR" image and is shown in FIG. 6. The histogram indicates that, on the average, the methods have nearly equivalent SNR, with $SNR_{\Delta\phi}/SNR_{\Delta R^*}=0.85$. A relative SNR histogram was also obtained for the 2-1 image which had a mean $SNR_{\Delta\phi}/SNR_{\Delta R^*}$ 32 0.91. Accounting for the signal averaging in the averaged images, the histogram width in FIG. 6 is nearly five times as wide as that expected from the width of the 2-1 histogram alone, indicating the presence of significant systematic variation in the relative SNR and thus in the $\Delta\phi$ and $\Delta R^*$ values themselves. For example, the $\Delta\phi$ method had a higher SNR in the superficial cortex/leptomeninges and in the regions of the choroid plexus, as is apparent from comparing FIGS. 5a and 5d. The absolute noise in the $\Delta\phi$ image was measured to be 1.4° using a region of interest of a noncontrast $\Delta\phi$ image in which baseline phase shifts were corrected. The maximum grey matter SNR was about 60°/1.4° or about 40:1. The relative rCBV determined from the average grey matter $\Delta\phi$ of 22.3° for the twenty two data points in FIG. 4a has an SNR or $\sqrt{22}.(22.3°)/1.4°$ or about 75:1. There were some very small regions of wraparound (e.g., lateral Sylvian fissures), where the maximum SNR was 180°/1.4° or about 130:1 for an individual image. As the mean SNR of the two methods is similar, the relative contrast to noise (CNR) of the methods is dependent on the variation in $\Delta\phi$ and $\Delta R^*$ between different tissues.

The invention demonstrates the value of imaging the phase-enhancement effects of bolus-injected paramagnetic contrast agents in the brain. Phase shifts were dynamically acquired and curves of tissue phase response to bolus injection approximate time-activity curves. Images have high tissue contrast and spatial resolution, and large phase shifts can be detected despite small cerebral blood volumes (about 4%). The effects of the initial bolus passage, recirculation, and slow equilibration into the peripheral extracellular fluid are manifest in the collected data. The phase shift as predicted was generally proportional to the tissue concentration, as shown in the phase response curves. Integration of the phase response curves provides a reasonable estimate of relative rCBV in normal grey and white matter and in acutely ischemic grey matter. The SNR in the rCBV image was about 75:1 in the normal grey matter and was comparable to that obtained from magnitude images, although there were some systematic differences in the two methods.

This phase difference method can also be applied to routine static enhancement methods to detect static paramagnetic concentration variations inherent in or outlining tumors, abscesses and other anomalies, for example by performing precontrast or postcontrast acquisitions using identical instrumental settings. The invention can also be applied to analyzing the kinetics of blood brain barrier enhancement which is slower than perfusion enhancement and provides a means for assessment of blood brain barrier permeability.

Furthermore, the invention can be used to assess magnetic field changes in intrinsic blood or intrinsic tissue such as due to hemoglobin or tissue oxygenation or oxidation states. For example, data can be acquired at identical settings before and during or after visual or other sensory stimulus, execution of a motor task, execution of a cognitive task, or an intervention such as radiation therapy or balloon angioplasty.

Figure 7:
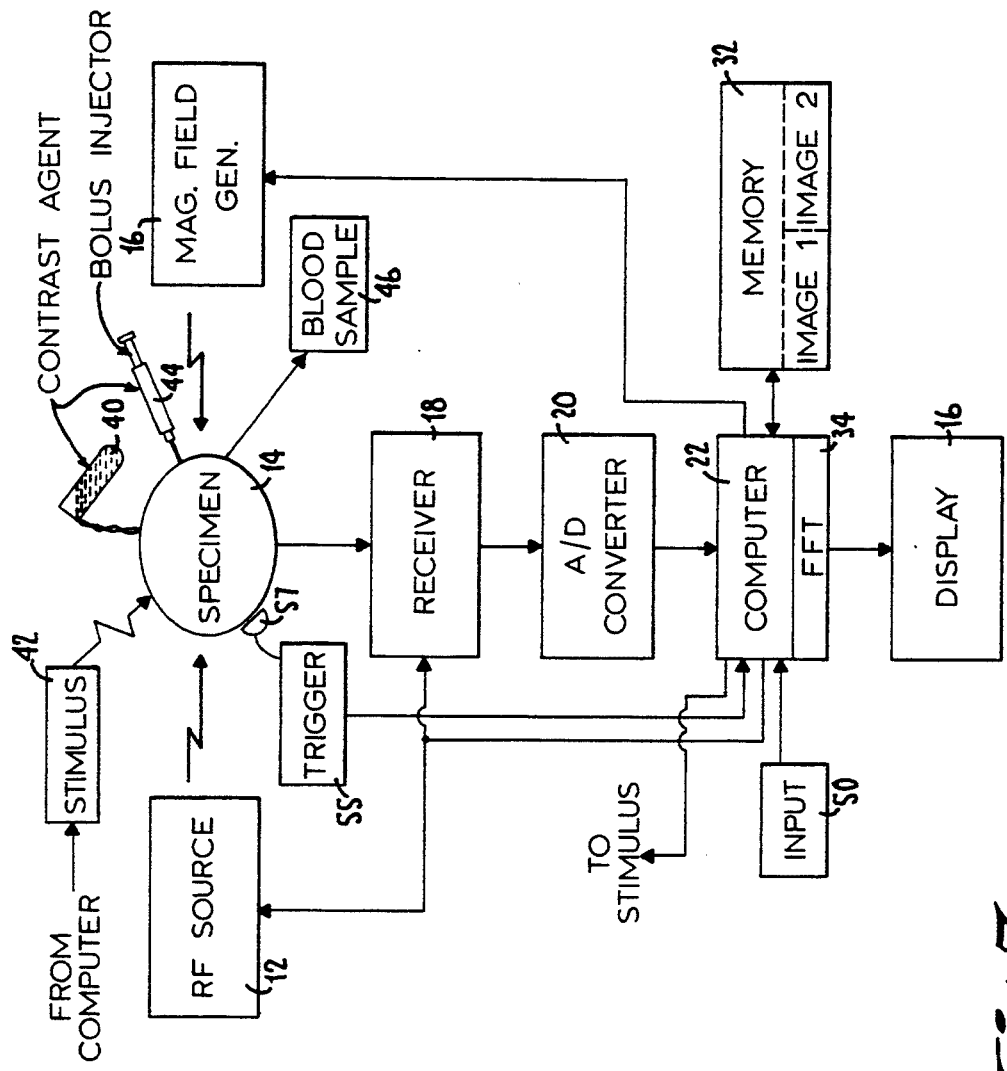
FIG. 7 is a schematic block diagram showing the elements and functional interconnections of an apparatus according to the invention.

FIG. 7 illustrates the apparatus of the invention. A source 12 provides a pulsed radio frequency signal for illumination of a patient 14 or other specimen along at least one plane or arbitrary volume traversing the specimen, in the presence of a magnetic field produced by field generator 16. A receiver 18 is responsive to the signal emitted by the specimen, which is of course modulated by the physical characteristics of the specimen, and more particularly by the magnetic properties of the volume elements or voxels of arbitrary size, which are traversed by the plane through the specimen. Sampling means comprising mixing the emitted signal with the signal driving the RF source 12, followed by analog to digital conversion via means 20 and computer processing means 22 acquire a plurality of numeric data samples representing an electromagnetic response of the specimen to the pulsed radio frequency signal. The collected samples can represent, for example, a magnetic resonance spin echo pulse sequence response of the specimen, a steady state free precession pulse sequence response, an echo planar spatial encoding pulse sequence, or a hybrid of one or more of these parameters, in each case incldding information necessary for obtaining a phase map of the voxels.

The computer 22 is coupled to a memory 32 and is operable to store at least two sets of the data samples corresponding to successive responses of the specimen to the pulsed radio frequency signal. A Fourier transform means 34, which can be a programmed function of computer 22 or an operation effected by an associated processor dedicated to performing fast Fourier transforms, is operable to convert the data samples to a map of phase angles representing a phase response of individual volume elements in the plane to the pulsed radio frequency signal. Computer 22 is operable to subtract the phase response of the individual volume elements in a first of the two sets from a second of the two sets. The results are shown on an output device preferably including a display 16, for example a CRT. It is possible to display the results as a digital on/off presentation of pixels corresponding to the voxels in the illuminated slice through the specimen, for example showing the voxels having a phase angle or phase difference in a certain range. Preferably, however, a phase difference map is displayed wherein at least one of grey levels, brightness, color or the like represent the values for each voxel.

The device may be used to obtain phase angle and phase difference measurements which occur with variations in a physiologic aspect of blood or tissue in the specimen, which variation have characteristic magnetic responses. For example, oxygenation and oxidation characteristics of the blood or tissue produce such variations, and can be perturbed by devices 42 which produce sensory stimulation, modulate motor functions, irradiate tissues with X-rays, heat, light, ultrasound or other irradiations, or mechanically alter blood passages, such as by using angioplasty balloons. Preferably, means 40 for perfusing the specimen are provided for introducing an agent effective to alter a magnetic property of the specimen. Alteration means 40, 42, or both, are effected between acquisition of the two sets of data samples, and in the case of means 40 preferably use either an agent comprising a paramagnetic contrast agent or an agent which alters a physiologic characteristic of blood leading to a difference in magnetic response. This is quite effective when the means for perfusing comprises a bolus injection means which can be regulated by a mechanical regulating device 44, operable to infuse a quantity of the paramagnetic contrast agent at a prescribed rate, into a vascular passage of the specimen. In addition, means 46 for sampling the blood during image acquisition can provide blood concentrations, which enable better assessment of absolute rCBV and rCBF.

Input or control means 50 allow the operator to control computer 22 for selecting alternative presentations for the graphic representation, whereby contrast can be maximized. Alternatively, the computer 22 can be programmed to prepare a variety of different maps, e.g., by selecting among subsets of a plurality of collected images and/or averages of the images to find one or more which have optimal contrast. Computer 22 can also be programmed to compute phase difference maps as outlined herein for any arbitrary pair of data acquisitions.

Triggering means 55 are provided to initiate collection of data samples. The triggering means or the computer 22 or input means 50 can include manually operable means whereby the operator can initiate, pause or terminate collection of a data sample. Timing means can be employed, e.g., as a function of computer 22, to repetitively collect a series of samples after a data collection operation begins. Preferably, the triggering means 55 include a sensor 57 coupled to the specimen and operable to initiate collection of an image at a predetermined time, whereby motion and artifacts in the map are reduced, or temporal registration between data collection and operation of the stimulating device(s) 42 is improved. The triggering means may comprise a cardiac gating trigger operable to initiate collection of the image at a predetermined point in a cardiac cycle of the specimen, or the cardiac gating trigger can be stored for retrospective computer processing.

The specific sampling technique for obtaining the spin echo or gradient echo response of voxels in the specimen can be as disclosed in detail in U.S. Pat. No. 4,766,381—Conturo et al, which is hereby incorporated. According to this technique, during an initial echo period three RF pulses are imposed on the main magnetic field with the first and third pulses rotating the magnetization by a first value (e.g., 90°) and the second pulse having a different value which may be larger than the first (e.g., double or 180°). An echo is created with the second pulse, and the third pulse converts this echo into negative longitudinal magnetization. After an inversion period and during a second echo period which follows, fourth and fifth RF pulses are applied to the specimen in the main field, thereby creating a spin echo with the fifth pulse. The pulses are all preferably applied with an oscillating field generally perpendicular to the main magnetic field.

As pulse sequences are repeated a number of times, e.g., 128 times, different gradient strengths are applied along the X and/or Y axes of the slice, providing position information useful for imaging. Within the gradient, the field strength varies with distance from the center. The nuclear moments within the slice respond (rotate) proportionally to the incident field strength, providing frequency and phase contributions to the signal from the specimen.

The X axis can be employed as the frequency encoding axis from which signals relating to the high and low frequency portions may be provided in composite form. Through Fourier transformation the signals are converted into a map of amplitude versus frequency. This permits correlation between the X coordinate of the signal and the frequency to be established. Similarly, the Y axis can be the phase encoding axis. The varying moments under the influence of the Y axis gradient can be employed to determine differences in gradient-induced phase oscillations between the high field region of the Y gradient and the low field region of the Y gradient. Fourier transformation will provide the distribution of phase oscillation frequencies which can be related to positions along the Y axis. The spin echo signal emitted by the specimen is digitized, and processed as discussed above. Further data acquisitions follow to permit phase difference measurements before and after perfusion, and the phase results are displayed.

The foregoing examples describe particular reconstruction strategies relying on phase shifts. It should be recognized that the presence of phase shifts can be assessed by other reconstruction strategies in which the resulting image brightness is related to the phase shift. Such reconstructions include phase-sensitive reconstruction with display of either the real or imaginary portions of the complex signal intensity (2) or (2) with or without correction for baseline phase errors (in this case, there is a one to one correspondence between real image brightness and phase angles for phase angles ranging from zero to $2\pi$). Other reconstructions which can monitor phase shifts include computation of the magnitude of the complex signal difference generated by complex number subtraction of, e.g., the n-th and first images according to $|\Delta Z| = |(Z_n - Z_1)|$, in which case $|\Delta Z|$ is approximately proportional to $\Delta \phi$ for very small values of $\Delta \phi$. In both these cases the signal to noise will be no greater and will usually be significantly less than that of a true calculated $\Delta \phi$ image as disclosed. Other calculations such as measurement of $\Delta \phi$ as $\Delta \phi = \arg(Z_n - Z_1)$ will only be accurate if the signal magnitudes are equal, i.e., if $|Z_n| = |Z_1|$, which generally will not be the case due to signal dephasing. In all these alternative reconstructions, the functional linear relation between pixel value (e.g., image brightness) and tissue paramagnetic concentration which is essential for assessment of rCBV and rCBF will not be obeyed. Therefore, the $\Delta \phi$ reconstruction as presented in the above description is preferred. Nevertheless, the invention is intended to encompass such alternative reconstructions relying on phase.

The invention is particularly applicable to identify cerebral vascular disease. Similar techniques can be used for diagnostic and/or measurement purposes with respect to other aspects of the cerebrum, or aspects of extracerebral brain tissue, the myocardium, spinal cord, kidney, liver, spleen or bowel, pancreas, skeletal muscle, lung or bone marrow, etc.

The invention having been disclosed in connection with certain concrete examples, variations will become apparent to persons skilled in the art. Whereas the invention is intended to encompass variations from the preferred embodiments disclosed as examples, reference should be made to the appended claims rather than the foregoing discussion, in order to assess the scope of the invention in which exclusive rights are claimed.

I claim:

1. A method for imaging a specimen comprising one of a substance traversed by passages and a material having a changeable magnetization, comprising the steps of:

illuminating the specimen along at least one plane traversing the localized area, using a pulsed radio frequency source, and collecting at least one baseline sample representing an electromagnetic response of the specimen to the pulsed radio frequency source;

altering a magnetic property of the specimen by one of perfusing the specimen with an agent having a magnetic property different from a corresponding magnetic property of the specimen at least in a localized area to be imaged, and physically perturbing the specimen to induce a macroscopic change in the magnetic property;

illuminating the specimen along at least one plane traversing the localized area, using the pulsed radio frequency source;

collecting a plurality of data samples representing the electromagnetic response of the specimen, including the agent, to the pulsed radio frequency source;

converting the data samples into a map of phase information for an array of volume elements in said plane to thereby construct an image from variations in the electromagnetic responses of the volume elements as represented by different shifts in one of frequency, phase, real, imaginary and complex signal information between the source illuminating the specimen and the data samples collected therefrom;

correcting phase angles representing the volume elements in the array to cancel variations that are present in both the data samples and the baseline sample; and, identifying variations in the localized area by corresponding variations in phase information of the volume elements in said map.

2. The method according to claim 1, comprising collecting a plurality of said samples, and correcting the phase angles of the volume elements in said map by canceling variations which are present in both of two selected subsets of the samples, the subsets respectively including at least one baseline sample taken prior to said altering step, at least one data sample taken after the altering step, selected groups taken from a plurality of data samples and baseline samples, and selected averages including the data samples and baseline samples.

3. The method according to claim 1, wherein the specimen is a biological specimen having tissues traversed by vascular passages, and wherein the altering step includes infusing the specimen with a paramagnetic contrast agent which perfuses the tissues.

4. The method according to claim 2, wherein at least one of the baseline samples and the data samples are collected repetitively over a range of different gradient echo parameters, and further comprising selecting among the baseline and data samples of different gradient echo parameters in order to maximize contrast in the phase angles.

5. The method according to claim 2, wherein the phase differences are produced by multiplying complex signals by a phase factor for at least one of improving signal to noise ratio and reducing wraparound.

6. The method according to claim 5, wherein an average baseline phase is computed from an argument of an average baseline complex signal.

7. The method according to claim 4, wherein the converting step includes performing a Fourier transformation on the samples along a group of gradient echo parameters, for at least one of improving a signal-to-noise ratio of the samples, minimizing phase wraparound, and assessment of intravoxel phase distribution.

8. The method according to claim 3, wherein the altering step comprises bolus-injecting the paramagnetic contrast agent, prior to collecting the data samples.

9. The method according to claim 1, wherein the agent comprises at least one paramagnetic Lanthanide element.

10. The method according to claim 9, wherein the agent comprises at least one of Dysprosium (Dy) and Gadolinium (Gd).

11. The method according to claim 1, wherein the specimen is a biological specimen having tissues traversed by vascular passages, and wherein the agent includes intrinsic blood having a variation from nominal intrinsic blood in one of an oxygenation level and an oxidation state thereof, said variation being produced by one of a physiologic characteristic of the specimen and an externally induced change.

12. The method according to claim 1, wherein the specimen comprises biological tissue and wherein said perturbation includes at least one of irradiation, application of light application of heat, application of sound, sensory stimulus motor stimulus application of balloon angioplasty, application of pharmacologic agents and execution of a cognitive task.

13. The method according to claim 10, wherein the agent is chosen from the group consisting of diamagnetic, ferromagnetic and superparamagnetic species.

14. The method according to claim 3, wherein the localized area includes cerebral tissue and the passages are vascular structures.

15. The method according to claim 1, wherein the localized area includes tissue of at least one of a cerebrum, extracerebral brain tissue, myocardium, spinal cord, kidney, liver, spleen, bowel, pancreas, skeletal muscle, lung, bone marrow, and connective tissue.

16. The method according to claim 1, and further comprising displaying said phase angle map using variations in at least one of luminance, saturation and hue to encode variations in phase angle.

17. The method according to claim 16, wherein the sample comprises cerebral tissue and the passages are vascular structures, and wherein said identifying step includes computer analyzing the map for a localized area of ischemia characterized by localized variations in the phase angles.

18. The method according to claim 16, wherein the sample comprises cerebral tissue and the flow passages are vascular structures including large arteries, veins, arterioles and venules, and small capillaries, and wherein the variations represent at least one of a tumor, infection, hematoma, embolism and infarction.

19. The method according to claim 16, wherein the localized area includes tissue of at least one of a cerebrum, extracerebral brain tissue, myocardium, spinal cord, kidney, liver, spleen, bowel, pancreas skeletal muscle, lung, bone marrow, and connective tissue, said identifying step including computer analyzing the map for localized variations in the phase angles characterizing an area of at least one of ischemia, tumor, hematoma, infection, embolism and infarction.

20. The method according to claim 19, further comprising assessing from the map at least one of absolute blood volume, relative blood volume, absolute blood flow, relative blood flow, and mean transit time, in a region of interest in the localized area.

21. An apparatus for magnetic resonance imaging, comprising:

a source of a pulsed radio frequency signal for illumination of a specimen along at least one plane traversing the specimen;

sampling means operable to acquire a plurality of data samples representing at least one of an electromagnetic gradient echo response and a spin echo response of the specimen to the pulsed radio frequency signal;

data processing means operable to store at least two sets of said data samples corresponding to successive responses of the specimen to the pulsed radio frequency signal, the data processing means including a Fourier transform means operable to convert the data samples to complex intensities, and the data processing means converting the complex intensities to a map of phase information representing a phase response of individual volume elements in the plane to the pulsed radio frequency signal through a macroscopic volume of the specimen, and means for correcting the phase response of the individual volume elements in a second of the two sets from a first of the two sets;

means for altering a magnetic property of the specimen in the macroscopic volume, between acquisition of the two sets; and, a display coupled to the data processing means for graphic representation of the phase response of the individual volume elements.

22. The apparatus according to claim 21, further comprising triggering means coupled to the source and the sampling means, the triggering means being operable for at least one of monitoring physiologic signals from the specimen, initiating external stimuli of the specimen, and triggering the source and the sampling means respectively to illuminate the specimen and to collect the data samples.

23. The apparatus according to claim 21, wherein the data processor is operable to process said data samples for quantification of at least one of rCBV, rCBF, and MTT.

24. The apparatus according to claim 21, further comprising means for physically perturbing the specimen for producing a change in said response at least in a localized area of the specimen.

25. The apparatus according to claim 21, further comprising means coupled to the specimen for blood sampling in connection with data acquisition.

26. The apparatus according to claim 21, wherein the agent comprises one of a paramagnetic contrast agent and an agent for altering a physiologic characteristic of blood.

27. The apparatus according to claim 26, wherein the means for altering comprises a bolus injection means operable to infuse a quantity of the paramagnetic contrast agent into a vascular passage of the specimen.

28. The apparatus according to claim 21, wherein the sampling means and the data processing means are operable in conjunction to acquire a plurality of successive responses of the specimen at different gradient echo parameters, and further comprising means for selecting alternative presentations for said graphic representation, whereby contrast can be maximized.

29. The apparatus according to claim 28, wherein the data processing means is operable to compute a baseline phase map from an argument of an average baseline complex signal calculated from a plurality of baseline data acquisitions.

30. The apparatus according to claim 21, wherein the sampling means is operable to encode a magnetic resonance spin echo pulse sequence response of the specimen.

31. The apparatus according to claim 21, wherein the sampling means is operable to encode a steady state free precession pulse sequence response.

32. The apparatus according to claim 21, wherein the sampling means is operable to encode an at least a partly echo planar spatial encoding pulse sequence.

33. The apparatus according to claim 21, further comprising triggering means coupled to the specimen and operable to initiate collection of an image at a predetermined time, whereby motion and artifacts in the map are reduced.

34. The apparatus according to claim 33, wherein the triggering means comprises a cardiorespiratory gating trigger operable for at least one of initiating collection of the image at a predetermined point in a cardiorespiratory cycle, providing cardiorespiratory data for retrospective processing of the data samples, initiating application of an external stimulus to the specimen, and enabling an external triggering means to initiate data acquisition.

35. The apparatus according to claim 22, wherein the triggering means is operable to effect at least one of EKG tracking, respiratory monitoring, EEG tracking and triggering of additional magnetic resonance imaging signals for at least one of reducing motion artifacts and collection of an image at least at one predetermined point in cardiac and respiratory cycles of the specimen.

* * * * *

UNITED STATES PATENT AND TRADEMARK OFFICE
CERTIFICATE OF CORRECTION

PATENT NO. : 5,352,979

DATED : October 4, 1994

INVENTOR(S) : Thomas E. CONTURO

It is certified that error appears in the above-identified patent and that said Letters Patent is hereby corrected as shown below:

Column 2, line 58, "Projectire" should be -- Projective --.

Column 6, equation [4], the equation should read as follows:

$$\Delta\phi_{bulk}=\Delta\omega T_E=4\pi\omega_0\chi_M FT_E C_p = PT_E C_p$$

Column 7, equation [5], the equation should read as follows:

$$\chi_M = \frac{Ng_e^2\beta_e^2 J(J+1)}{3kT} + f(J) \approx \frac{N\mu_{eff}^2}{3kT}$$

Column 7, line 31, "I.A.S" should be -- I·A·S --.

UNITED STATES PATENT AND TRADEMARK OFFICE
CERTIFICATE OF CORRECTION

PATENT NO. : 5,352,979
DATED : October 4, 1994
INVENTOR(S) : Thomas E. CONTURO

It is certified that error appears in the above-identified patent and that said Letters Patent is hereby corrected as shown below:

Column 7, line 35, "AI.S" should be -- AI·S --.

Column 9, equation [10], the equation should read as follows:

$$\Delta\phi_{vox} = 4\pi\omega_0\chi_M T_E C_{vasc} \langle F \rangle_{vasc} rCBV,$$

Column 9, line 8, "rCBV.$C_{vasc}$" should be -- rCBV·$C_{vasc}$ --.

Column 9, line 15, the equation should read as follows:

$$4\pi\omega_0\chi_M T_E \langle C_{vasc} \rangle F \bullet rCBV$$

Column 10, line 5, "rs" should be -- vs --.

UNITED STATES PATENT AND TRADEMARK OFFICE
CERTIFICATE OF CORRECTION

PATENT NO. : 5,352,979

DATED : October 4, 1994

INVENTOR(S) : Thomas E. CONTURO

It is certified that error appears in the above-identified patent and that said Letters Patent is hereby corrected as shown below:

Column 11, line 12, the equation should read as follows:

$$\Delta\phi_{n-1} = \arg(\hat{Z}_{n-1}), \text{ where } \hat{Z}_{n-1} = Z_n/Z_1 \text{ with } Z_n$$

Column 11, line 25, the equation should read as follows:

$$\langle\Delta\phi\rangle = \sum_{i=1}^{N-1} \Delta\phi_i / (N-1)$$

Column 11, lines 25-26, the second occurrence of "i/(N-1)." should be deleted.

Column 15, line 4, "32" should be replaced with -- = --.

Column 16, line 19, "incldding" should be -- including --.

UNITED STATES PATENT AND TRADEMARK OFFICE
CERTIFICATE OF CORRECTION

PATENT NO. : 5,352,979
DATED : October 4, 1994
INVENTOR(S) : Thomas E. CONTURO

It is certified that error appears in the above-identified patent and that said Letters Patent is hereby corrected as shown below:

Column 18, line 17, "(2) or (2)" should be -- $\Re(Z)$ or $\Im(Z)$ --.

Column 18, line 32, " $|Z_n|=|Z_1|$ " should be -- $|Z_n| = |Z_1|$ --.

Claim 12, column 20, line 18, -- , -- should be inserted after "light".

Claim 12, column 20, line 19, -- , -- should be inserted after the first and second occurrences of "stimulus".

Claim 12, column 20, line 20, -- , -- should be inserted after "agents".

Claim 18, column 20, line 49, -- ischemia -- should be inserted after "embolism".

Claim 19, column 20, line 53, -- , -- should be inserted after "pancreas".

Signed and Sealed this

Twenty-fifth Day of April, 1995

*Attest:*

BRUCE LEHMAN

*Attesting Officer*     *Commissioner of Patents and Trademarks*